United States Patent [19]

Ubayama et al.

[11] Patent Number: 5,025,173
[45] Date of Patent: Jun. 18, 1991

[54] EFM-SIGNAL COMPARATOR

[75] Inventors: Takashi Ubayama; Eiichi Suzuki; Morito Morishima, all of Hamamatsu, Japan

[73] Assignee: Yamaha Corporation, Hamamatsu, Japan

[21] Appl. No.: 403,826

[22] Filed: Sep. 7, 1989

[30] Foreign Application Priority Data

Sep. 8, 1988 [JP] Japan ............................... 63-225454

[51] Int. Cl.$^5$ .............................................. H03K 5/04
[52] U.S. Cl. ..................................... 307/265; 307/234; 307/268; 328/164
[58] Field of Search ............... 307/234, 265, 264, 355, 307/359, 350, 268; 328/164

[56] References Cited

U.S. PATENT DOCUMENTS

| | | | |
|---|---|---|---|
| 3,883,756 | 5/1975 | Dragon | 307/265 |
| 4,449,061 | 5/1984 | Yasuda et al. | 307/265 |
| 4,562,549 | 12/1985 | Tanaka et al. | 307/265 |
| 4,881,041 | 11/1989 | Kawanabe et al. | 307/265 |

Primary Examiner—John Zazworsky
Attorney, Agent, or Firm—Burns, Doane, Swecker & Mathis

[57] ABSTRACT

An EFM-signal comparator which superposes a direct voltage on an input EFM signal, and produces a square wave of a predetermined duty cycle (50% typically) by comparing the superposed signal of the direct voltage and the input EFM signal with a predetermined threshold voltage. The signal comparator having a primary direct-voltage-output circuit which produces a direct voltage corresponding to the "1" level duration of the square wave, a secondary direct-voltage-output circuit which produces a direct voltage corresponding to the "0" level duration of the square wave, a switching circuit which outputs either the direct voltage from the primary direct-voltage-output circuit or the direct voltage from the secondary direct-voltage-output circuit, a voltage-output circuit which outputs a voltage corresponding to the direct voltage outputted from the switching circuit, and a smoothing circuit which smoothes and superposes the voltage outputted from the voltage-output circuit on the input EFM signal. The EFM-signal comparator can be integrated into an LSI except for large-scale wave-smoothing capacitors, because all of the other components are small enough to be manufactured by CMOS, while the large-scale wave-smoothing capacitors are too large to be produced by CMOS.

5 Claims, 1 Drawing Sheet

EFM-SIGNAL COMPARATOR

BACKGROUND OF THE INVENTION

1. Field of the Invention

The present invention relates to an EFM (Eight-to-Fourteen Modulation) signal comparator appropriate to be built into a large-scale integrated circuit.

2. Prior Art

Compact discs store data coded in the form of EFM signals. The waveform of the EFM signals read from a compact disc is shaped so that the duty cycle thereof is regulated to 50% before the signals are supplied to the main part of a CD amplifier. An EFM-signal comparator is used to convert the read data into a train of pulses having a duty cycle of 50%.

FIG. 1 shows a configuration of a conventional EFM-signal comparator. In FIG. 1, numeral 1 designates an input terminal to which input EFM signals are applied. Input terminal 1 is connected to an output terminal 5 via capacitor 2, and inverters 3 and 4. To the output terminal of inverter 3, a series of resistor 7 and capacitor 8 is connected, whereas to the output terminal of inverter 4, a series of resistor 10 and capacitor 11 is connected. The connecting point of resistor 7 and capacitor 8 is connected to the noninverting input terminal of operational amplifier 12, while the connecting point of resistor 10 and capacitor 11 is connected to the inverting input terminal of operational amplifier 12. The output terminal of operational amplifier 12 is connected to the input terminal of inverter 3 via resistor 14.

The input EFM signals transmitted from the optical pick-up are outputted from inverter 3 in the form of a square pulse train. This square pulse train has a duty cycle specified by the relationship between the EFM signal level and the input threshold level of inverter 3. The square pulse train produced from inverter 3 is smoothed by resistor 7 and capacitor 8, and an average voltage Va thereof is supplied to the noninverting input terminal of operational amplifier 12. The square pulse train is also supplied to inverter 4. The inverted signal from inverter 4 is smoothed by resistor 10 and capacitor 11, and is supplied to the inverting input terminal of operational amplifier 12.

When the duty cycle of the pulse train outputted from inverter 3 is larger than 50%, voltage Va is higher than voltage Vb, so that a positive voltage is produced from the operational amplifier 12. This positive voltage is supplied to the input terminal of inverter 3 via resistor 14. As a result, the EFM signal level at the input terminal of inverter 3 is raised, so that the duty cycle of the square pulse train at the output terminal of inverter 3 decreases, which decreases voltage Va. In short, when Va>Vb, voltage Va is lowered, so that Va becomes equal to Vb. On the other hand, when the duty cycle of the pulse train produced from inverter 3 is less than 50%, voltage Va is lower than voltage Vb, so that a negative voltage is produced from operational amplifier 12. The negative voltage is supplied to the input terminal of inverter 3 via resistor 14. As a result, the EFM-signal level at the input terminal of inverter 3 is lowered, so that the duty cycle of the square pulse train produced from inverter 3 increases, which increases voltage Va. In short, when Va<Vb, voltage Va is raised, so that Va becomes equal to Vb. Thus, the duty cycle of EFM signals outputted from the output terminal 5 is regulated to 50%.

The conventional EFM-signal comparator described above, however, uses a general-purpose operational amplifier 12. Consequently, the part defined by a dash-dotted line in FIG. 1 cannot be integrated into an LSI and must be placed outside the LSI. This hinders the construction of an LSI which includes the entire compact disc reproduction circuit.

SUMMARY OF THE INVENTION

It is therefore an object of the present invention to provide an EFM-signal comparator which requires no external operational amplifier, facilitating its incorporation into an LSI.

In one aspect of the present invention, there is provided an EFM-signal comparator which superposes a direct voltage on an input EFM signal, and produces a square wave of a predetermined duty cycle by comparing the superposed signal of the direct voltage and the input EFM signal with a predetermined threshold voltage, the EFM-signal comparator comprising:

primary direct-voltage-output means which produces a direct voltage corresponding to the "1" level duration of the square wave; direct voltage corresponding to the "0" level duration of the square wave;

switching means which outputs one of the direct voltages either from the primary direct-voltage-output means or from the secondary direct-voltage-output means;

voltage-output means which outputs a voltage corresponding to the direct voltage outputted from the switching means; and smoothing means which smoothes and superposes the voltage outputted from the voltage-output means on the input EFM signal.

DESCRIPTION OF THE PREFERRED EMBODIMENT

The invention will now be described with reference to the accompanying drawing.

Figure 1:
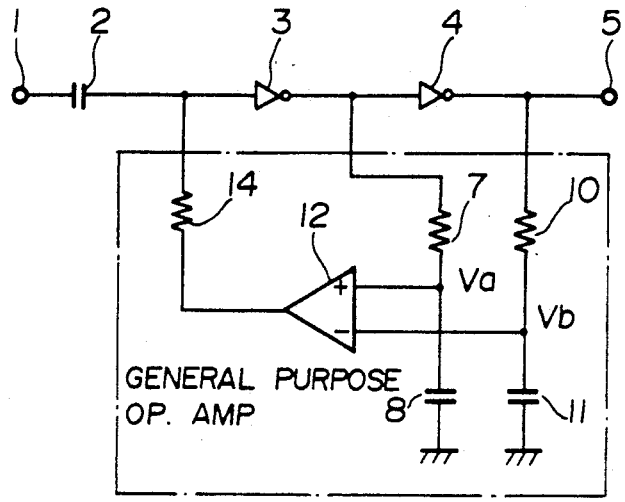
FIG. 1 is a circuit diagram of a conventional EFM-signal comparator.
Figure 2:
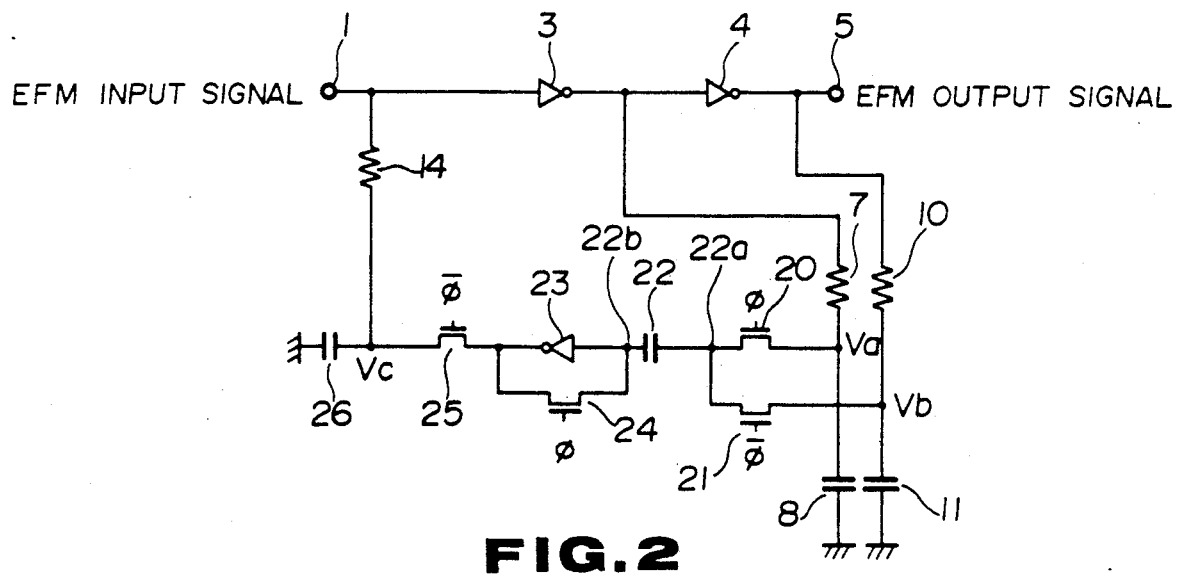
FIG. 2 is a circuit diagram of an EFM-signal comparator according to an embodiment of the present invention.

FIG. 2 is a circuit diagram of an EFM-signal comparator according to an embodiment of the present invention. In FIG. 2, the reference numerals designating corresponding parts are the same as those in FIG. 1, and so the description thereof will be omitted.

In FIG. 2, numerals 20 and 21 designate FETs (Field-Effect Transistors). To the drain of FET 20, voltage Va is applied, whereas to the drain of FET 21, voltage Vb is applied. The sources of FETs 20 and 21 are connected in common to a terminal 22a of capacitor 22. The other terminal 22b of capacitor 22 is connected to the input terminal of inverter 23 and the drain of FET 24. The output terminal of inverter 23 is connected to the source of FET 24 as well as to the drain of FET 25. The source of FET 25 is connected to a terminal of capacitor 26 as well as to a terminal of resistor 14. The other terminal of capacitor 26 is grounded.

In this configuration, clock signal $\phi$ is applied to the gates of FETs 20 and 24, whereas clock signal $\bar{\phi}$, which is an inverted signal of clock signal $\phi$, is applied to the gates of FETs 21 and 25. Consequently, FETs 20 and 24 turn on when FETs 21 and 25 turn off, and vice versa.

This configuration consists of a CMOS (Complementary Metal-Oxide Semiconductor) except capacitors 8, 11, and 26, which must be placed outside the LSI, because these capacitors must be large enough to produce large time constants. In other words, the components other than capacitors 8, 11, and 26, that is, FETs 20, 21, 24, and 25, small capacitor 22, resistors 7, 10 and 14, and inverters 3, 4, and 23, are easily integrated because they are made of CMOS and are very small.

The operation of the embodiment is as follows:

First, when clock signal $\bar{\phi}$ is at the "0" level, that is, when clock signal $\phi$ is at the "1" level, FETs 20 and 24 are in the "on" state. When FET 20 is in the "on" state, voltage Va is applied to terminal 22a of capacitor 22, and when FET 24 is in the "on" state, the input and output terminals of inverter 23 are short-circuited. This causes the voltage of the input terminal of inverter 23 to be at the threshold voltage Vth owing to a characteristic of CMOS. Thus, capacitor 22 is supplied with voltages Va and Vth at its terminals.

In contrast, when clock signal $\bar{\phi}$ is at the "1" level, FETs 21 and 25 are in the "on" state, whereas FETs 20 and 24 are in the "off" state. When FET 24 is in the "off" state, the other terminal 22b of capacitor 22 is connected only to the input terminal of inverter 23. Since the input impedance of inverter 23 is extremely high, the other terminal 22b of capacitor 22 is substantially in the "open" state. In addition, when FET 21 is in the "on" state, voltage Vb is applied to the terminal 22a of capacitor 22, so that the voltage of the other terminal 22b of capacitor 22 varies from Vth to $\{Vb-(Va-Vth)\}$, because capacitor 22 is charged to the voltage (Va−Vth) before FET 21 turns to the "on" state. As a result, when voltage Vb is larger than Va, the voltage at the other terminal 22b of capacitor 22 is above the threshold voltage Vth, so that inverter 23 outputs the "0" level, and capacitor 26 is discharged through contrast, when voltage Va is larger than voltage Vb, the voltage FET 25. In at the other terminal 22b of capacitor 22 is below threshold voltage Vth, so that inverter 23 outputs the "1" level, and capacitor 26 is charged through FET 25.

The charge and discharge of capacitor 26 is performed at a time constant specified by the capacitance of capacitor 26 and the on-resistance of FET 25, and the output signal of inverter 23 is smoothed according to the time constant. As a result, direct voltage Vc specified by the charge and discharge duration of capacitor 26 is obtained at the terminal of capacitor 26, and is superposed on the input EFM signal through resistor 14.

When clock signal $\phi$ is "0" again, FET 25 is in the "off" state, and so capacitor 26 is substantially in the "open" state, and this is because the impedance of input terminal 1 and that of inverter 3 are very high. As a result, voltage Vc of capacitor 26 is maintained at the voltage Vc when FET 25 turns off.

Thus, when voltage Va<Vb and $\bar{\phi}$ is in "1" state, capacitor 26 is discharged, and the voltage Vc superposed on the EFM signal at input terminal 1 is decreased. Consequently, the level of input EFM decreases so that the duty cycle of the EFM signal outputted from inverter 3 is increased, while that of the EFM signal outputted from inverter 4 is decreased. In short, when Va<Vb, voltage Va is controlled to increase, and voltage Vb is controlled to decrease.

On the other hand, when voltage Va>Vb and $\bar{\phi}$ is in the "1" state, capacitor 26 is charged, and the voltage Vc superposed on the EFM signal at input terminal 1 is increased. Consequently, the level of input EFM increases so that the duty cycle of the EFM signal outputted from inverter 3 is decreased, while that of the EFM signal outputted from inverter 4 is increased. In short, when Va>Vb, voltage Va is controlled to decrease, and voltage Vb is controlled to increase.

Thus, voltages Va and Vb are controlled to be maintained at equal levels by the circuit. When these voltages Va and Vb are equal, voltage Vc is equal to the threshold voltage Vth of inverter 3, and the duty cycle of the output EFM signal is maintained at 50%.

Although a specific embodiment of an EFM-signal comparator constructed in accordance with the present invention has been disclosed, it is not intended that the invention be restricted to either the specific configuration or the uses disclosed herein. Modifications may be made in a manner obvious to those skilled in the art. Accordingly, it is intended that the invention be limited only by the scope of the appended claims.

What is claimed is:

1. An EFM-signal comparator which superposes a direct voltage on an input EFM signal, and produces a square wave of a predetermined duty cycle by comparing the superposed signal of the direct voltage and the input EFM signal with a predetermined threshold voltage, said EFM-signal comparator comprising:

primary direct-voltage-output means which produces a direct voltage corresponding to a duration of a first level of said square wave;

secondary direct-voltage-output means which produces a direct voltage corresponding to a duration of a second level of said square wave, said second level being different from said first level;

switching means which selectively outputs one of said direct voltages either from said primary direct-voltage-output means or from said secondary direct-voltage-output means;

voltage-output means which outputs a voltage corresponding to the direct voltage outputted from said switching means; and smoothing means which smoothes and superposes said voltage outputted from said voltage-output means on said input EFM signal.

2. An EFM-signal comparator according to claim 1 wherein said primary direct-voltage output means further comprises:

a primary inverter which inverts said input EFM signal, a resistor having two terminals, one of said terminals being connected to said inverter, and a capacitor having two terminals one of said capacitor terminals being connected to the other terminal of said resistor and the other terminal of said capacitor being grounded, and wherein said secondary direct-voltage-output means further comprises:

a secondary inverter which inverts an output of said primary inverter, a secondary inverter resistor having two terminals one of said secondary resistor terminals being connected to said secondary inverter, and a secondary inverter capacitor having two terminals one of said secondary inverter capacitor terminals being connected to the other terminal of said secondary inverter resistor and the other terminal of said secondary capacitor being grounded.

3. An EFM signal comparator according to claim 1 wherein said switching means consists of a pair of FETs, one of which is connected between said primary direct-voltage-output means and said voltage-output means, and the other of which is connected between said secondary direct-voltage-output means and said voltage-output means.

4. An EFM signal comparator according to claim 1 wherein said voltage-output means comprises a capacitor whose one terminal is connected to an output of said switching means, an inverter whose input is connected to the other terminal of said capacitor, and a FET which is connected across the input and output terminals of said inverter.

5. An EFM signal comparator according to claim 1 wherein said smoothing means comprises a capacitor whose one terminal is connected to the input terminal of said primary inverter via a resistor and whose other terminal is grounded, and a FET connected between said voltage-output means and said capacitor.

* * * * *